United States Patent
Zhu et al.

(10) Patent No.: US 10,269,819 B2
(45) Date of Patent: Apr. 23, 2019

(54) INTEGRATED STRUCTURES AND METHODS OF FORMING VERTICALLY-STACKED MEMORY CELLS

(71) Applicant: Micron Technology, Inc., Boise, ID (US)

(72) Inventors: Hongbin Zhu, Boise, ID (US); Gordon A. Haller, Boise, ID (US); Charles H. Dennison, San Jose, CA (US); Anish A. Khandekar, Boise, ID (US); Brett D. Lowe, Boise, ID (US); Lining He, Singapore (SG); Brian Cleereman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/497,009

(22) Filed: Apr. 25, 2017

(65) Prior Publication Data
US 2017/0229470 A1 Aug. 10, 2017

Related U.S. Application Data

(62) Division of application No. 14/666,002, filed on Mar. 23, 2015, now Pat. No. 9,659,949.

(51) Int. Cl.
| | |
|---|---|
| H01L 27/11556 | (2017.01) |
| H01L 27/11582 | (2017.01) |
| H01L 27/11524 | (2017.01) |
| H01L 27/1157 | (2017.01) |

(52) U.S. Cl.
CPC .... *H01L 27/11556* (2013.01); *H01L 27/1157* (2013.01); *H01L 27/11524* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 9,209,031 B2 | 12/2015 | Baenninger et al. | |
| 9,287,283 B2* | 3/2016 | Lim | H01L 27/11551 |
| 2010/0237402 A1* | 9/2010 | Sekine | H01L 27/11551 |
| | | | 257/324 |
| 2012/0100681 A1* | 4/2012 | Fang | H01L 21/02057 |
| | | | 438/269 |
| 2012/0289032 A1* | 11/2012 | Furusawa | H01L 21/76832 |
| | | | 438/478 |
| 2014/0273462 A1* | 9/2014 | Simsek-Ege | H01L 27/11578 |
| | | | 438/696 |

* cited by examiner

*Primary Examiner* — Ali Naraghi
(74) *Attorney, Agent, or Firm* — Wells St. John P.S.

(57) ABSTRACT

Some embodiments include a method of forming vertically-stacked memory cells. An opening is formed through a stack of alternating insulative and conductive levels. Cavities are formed to extend into the conductive levels along sidewalls of the opening. At least one of the cavities is formed to be shallower than one or more others of the cavities. Charge-blocking dielectric and charge-storage structures are formed within the cavities. Some embodiments include an integrated structure having a stack of alternating insulative and conductive levels. Cavities extend into the conductive levels. At least one of the cavities is shallower than one or more others of the cavities by at least about 2 nanometers. Charge-blocking dielectric is within the cavities. Charge-storage structures are within the cavities.

13 Claims, 8 Drawing Sheets

INTEGRATED STRUCTURES AND METHODS OF FORMING VERTICALLY-STACKED MEMORY CELLS

RELATED PATENT DATA

This patent resulted from a divisional of U.S. patent application Ser. No. 14/666,002, which was filed Mar. 23, 2015, and which is hereby incorporated herein by reference.

TECHNICAL FIELD

Integrated structures and methods of forming vertically-stacked memory cells.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured to comprise vertically-stacked memory cells. It is desired to develop improved NAND architecture, and improved methods of forming NAND architecture.

DETAILED DESCRIPTION OF THE ILLUSTRATED EMBODIMENTS

In some embodiments, one or more memory cells of a vertical stack may be formed to be different relative to others of the memory cells during fabrication of vertical NAND strings. Example embodiments are described with reference to FIGS. 1-8.

Figure 1:
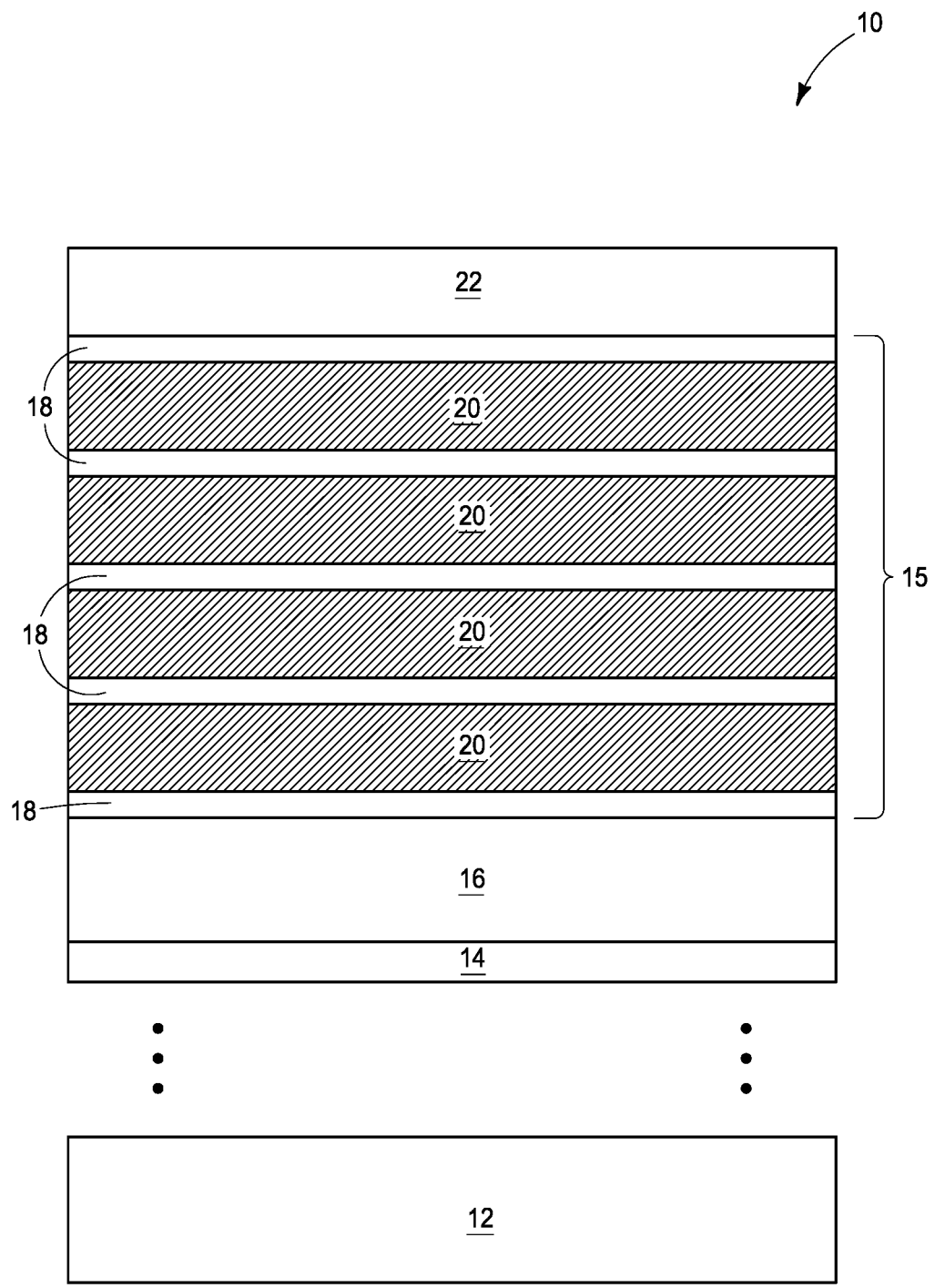
FIGS. 1-8 are cross-sectional views of semiconductor constructions at process stages of example embodiment methods of forming integrated structures.

Referring to FIG. 1, a semiconductor construction 10 is shown to comprise a stack 15 of alternating first and second levels 18 and 20. The levels 18 may be electrically insulative, and the levels 20 may be electrically conductive. The electrically conductive levels 20 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the electrically conductive levels 20 may comprise n-type doped polycrystalline silicon (i.e., n-type doped polysilicon). The electrically insulative levels 18 may comprise any suitable composition or combination of compositions; and may, for example, comprise silicon dioxide.

The levels 18 and 20 may be of any suitable thicknesses; and may, for example, have thicknesses within a range of from about 10 nanometers (nm) to about 300 nm. In some applications, the levels 18 may be thinner than the levels 20. For instance, levels 18 may be about 20 nm thick and levels 20 may be about 30 nm thick.

The electrically conductive levels 20 may be utilized to pattern control gates of flash devices. In such applications, a vertical string of memory cells (such as, for example, a vertical NAND string of memory cells) may be fabricated, with the number of memory cells in each string being determined by the number of electrically conductive levels 20. The stack may comprise any suitable number of electrically conductive levels. For instance, the stack may have 8 electrically conductive levels, 16 electrically conductive levels, 32 electrically conductive levels, 64 electrically conductive levels, etc.

The stack is over a source-side select-gate material 16, which is over an etchstop material 14.

The source-side select-gate material 16 may comprise any suitable electrically conductive composition or combination of compositions; and may, for example, comprise p-type doped silicon and/or other suitable conductively-doped semiconductor material.

The etchstop material 14 may comprise, for example, one or more oxides; such as, for example, one or more of aluminum oxide, hafnium oxide, etc.

The etchstop material 14 is supported by a base 12. A break is provided between the material 14 and the base 12 to indicate that there may be additional materials and/or integrated circuit structures between the base and the material 14.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A capping material 22 is over stack 15. The capping material 22 may comprise, for example, silicon nitride and/or silicon dioxide.

The construction of FIG. 1 may be formed with any suitable processing. For instance, the materials 14, 16, 18, 20 and 22 may be formed in sequential order over base 12 using one or more of atomic layer deposition (ALD), chemical vapor deposition (CVD), and physical vapor deposition (PVD) with appropriate deposition parameters and materials, and utilizing one or more process chambers.

In some embodiments, two or more of the insulative levels 18 may be modified relative to others of the insulative levels. For instance, the insulative levels may comprise silicon dioxide formed utilizing tetraethylorthosilicate precursor. A set of slow-etch-rate levels may be formed under conditions so that they have a first etch rate when exposed to hydrofluoric acid etchant, and a set of fast-etch-rate levels may be formed under different conditions so that they have a second, faster, etch rate when exposed to the hydrofluoric acid etchant. For instance, the fast-etch-rate insulative levels may be formed utilizing a reduced, or eliminated, low-frequency component as compared to the deposition conditions utilized for forming the slow-etch-rate insulative levels. Additionally, or alternately, the slow-etch-rate levels may be exposed to densification conditions (for instance, $N_2O$/argon plasma) which are omitted relative to the fast-etch-rate levels. In some embodiments, the slow-etch-rate insulative levels and the fast-etch-rate insulative levels may comprise, consist essentially of, or consist of silicon dioxide; with the fast-etch-rate insulative levels having a lower density as compared to the slow-etch-rate insulative levels.

The modification of some of the insulative levels relative to others may enable one or more cavities later formed in conductive levels 20 (shown in FIG. 4) to be formed at different depths as compared to other cavities formed in the conductive levels.

In alternative, or additional, embodiments, one or more of the conductive levels 20 may be modified relative to others to enable one or more of the cavities formed in the conductive levels 20 to be at a different depth as compared to others. For instance, the conductive levels may comprise conductively-doped silicon, and one or more of the conductive levels may comprise a different concentration of dopant and/or a different dopant relative to others. Such difference may enable one or more of the conductive levels to etch faster than others when exposed to etching conditions. Specific embodiments of this concept are described with reference to FIGS. 7 and 8.

Figure 2:
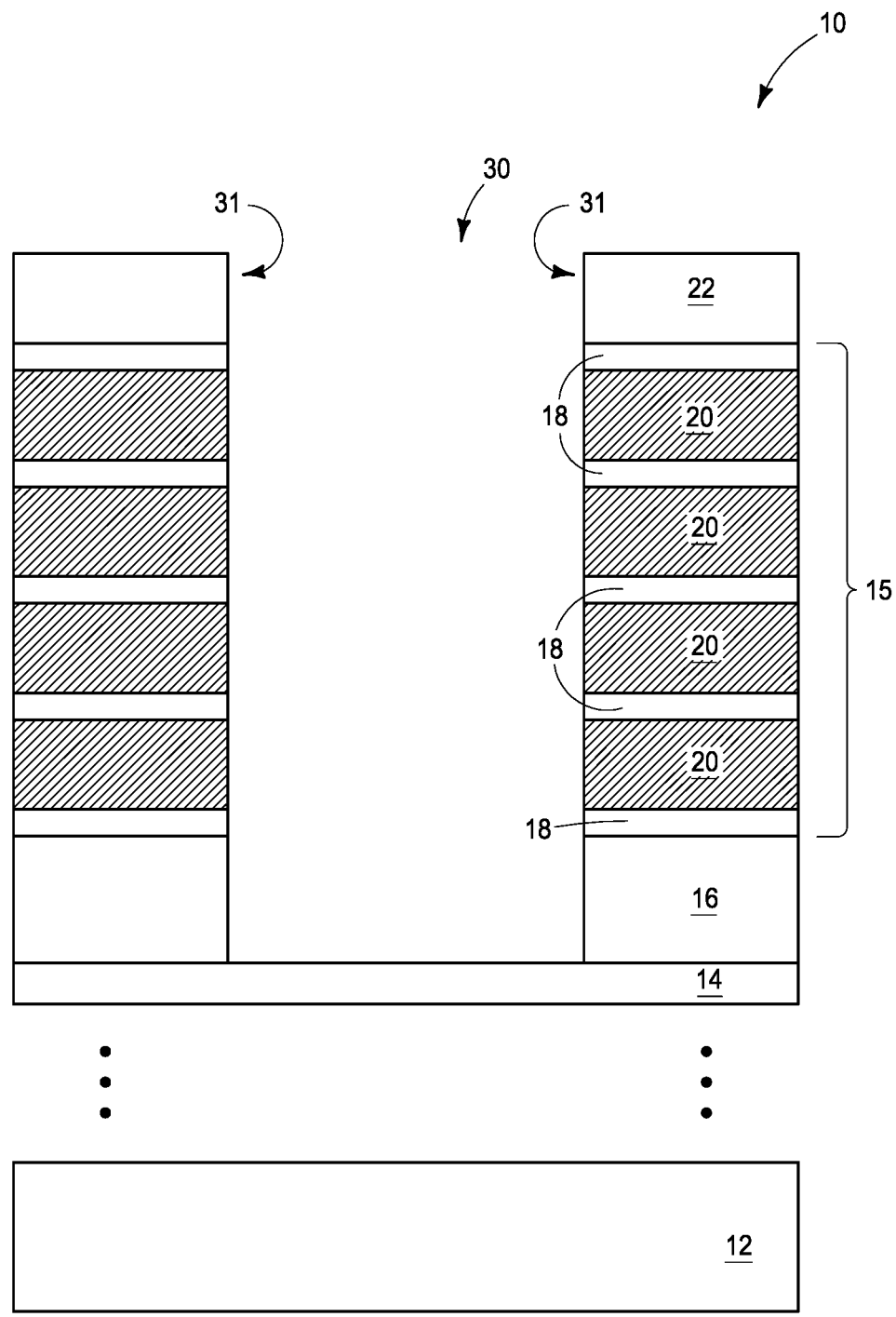

Referring to FIG. 2, an opening 30 is formed to extend through materials 16, 18, 20 and 22. The opening 30 extends to the etchstop material 14, and may even extend partially into such etchstop material. However, the opening does not extend entirely through the etchstop material. The illustrated opening is an example, and a plurality of such openings may be formed and treated during fabrication of an integrated assembly (e.g., a NAND memory array).

The opening 30 may be formed utilizing any suitable processing. For instance, a patterned mask (not shown) may be formed over material 22 to define a location of opening 30, and then the opening may be extended through the materials 16, 18, 20 and 22 with one or more etches. The patterned mask may be removed during and/or after extending opening 30 into one or more of the materials 16, 18, 20 and 22. The patterned mask utilized to define the opening 30 may be any suitable mask, including, for example, photolithographically-patterned photoresist and/or a mask formed utilizing pitch-multiplication methodologies.

The opening 30 has sidewalls 31. The opening may be a closed shape when viewed from above (for instance, a circle, ellipse, rectangle, square, etc.) so that the illustrated sidewalls 31 are part of a continuous sidewall that extends around such closed shape.

The formation of opening 30 may leave one or more undesired materials (not shown) along the sidewall surfaces. Example materials may be polymeric byproduct materials resulting from the etching conditions utilized to form opening 30, native oxide formed along silicon of conductive levels 20, etc. Such undesired materials may be removed with one or more cleaning etches. For instance, a so-called decap etch may be utilized to remove native oxide. The decap etch may utilize hydrofluoric acid and/or other suitable components.

Figure 3:
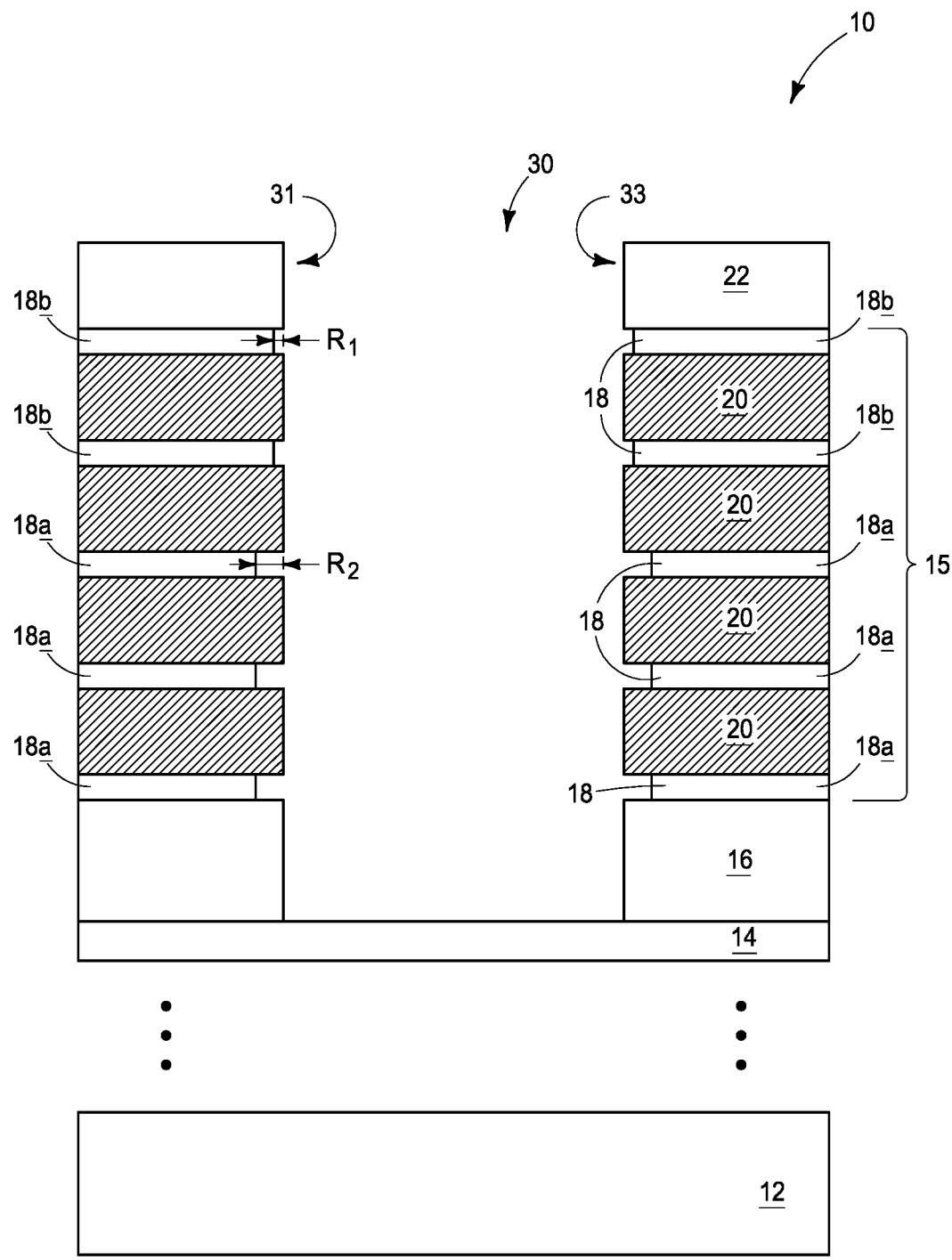

The hydrofluoric acid etch may also remove material from the insulative levels 18. FIG. 3 shows construction 10 at a process stage subsequent to a hydrofluoric acid etch in accordance with an embodiment. The insulative levels 18 comprise silicon dioxide, and three of the illustrated insulative levels (labeled 18a) are different than two others of the levels (labeled 18b). The difference is such that levels 18a etch faster than levels 18b. Such difference may be a difference in density, chemistry, etc. In some embodiments, levels 18a may etch at least about twice as fast levels 18b, at least about three times as fast, at least about five times as fast, etc.

In the shown embodiment, insulative levels 18b are recessed to a first dimension $R_1$, and insulative levels 18a are recessed to a second dimension $R_2$. The second dimension $R_2$ may be at least about twice as large as the first dimension, at least about three times as large as the first dimension, etc. For instance, in some embodiments the first dimension $R_1$ may be about 2 nm, and the second dimension $R_2$ may be within a range of from about 4 nm to about 10 nm. In some embodiments, first dimension $R_1$ may be about 2 nm, and the second dimension $R_2$ may be within a range of from about 4 nm to about 6 nm.

In the shown embodiment, the bottom three insulative levels of stack 15 are modified to have a faster etch rate than others of the insulative levels. In other embodiments, other insulative levels within the stack may be modified to have the faster etch rate. In some embodiments, at least the bottommost pair of insulative levels of stack 15 are modified relative to others of the insulative levels.

In some embodiments, the insulative levels having the faster etch rate may be referred to as modified insulative levels. In other embodiments, the modification may be to slow an etch rate of some insulative levels relative to others. Accordingly, the "modified" insulative levels may be the levels having the slower etch rate.

Figure 4:
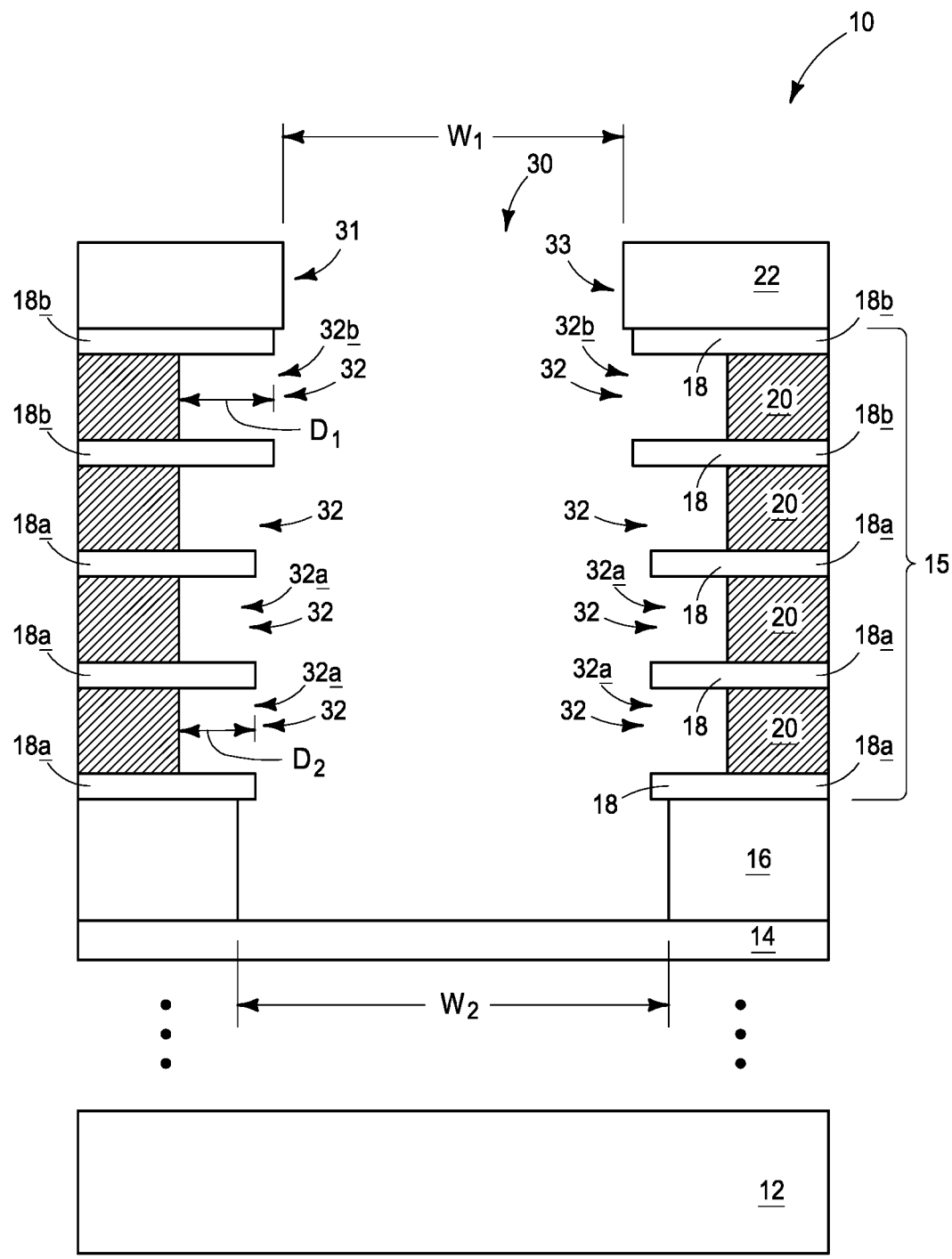

Referring to FIG. 4, conductive levels 20 are recessed to form cavities 32. In embodiments in which conductive levels 20 comprise doped silicon, such recessing may be accomplished utilizing an etch containing tetramethylammonium hydroxide (TMAH). In the shown embodiment, the etching has also recessed into source-side select-gate material 16. Such may occur if material 16 also comprises doped silicon in embodiments in which the etchant utilizes TMAH. The etching into material 16 is not as deep as the etching into levels 20 in the shown embodiment. Such may occur if material 16 is differently doped than levels 20. In other embodiments (not shown) the etching into material 16 may be as deep as, or deeper than, the etching into levels 20.

In the shown embodiment, some of the cavities 32 (labeled 32b) are deeper than others of the cavities (labeled 32a). Such difference results from insulative levels 18a being more recessed than levels 18b at the processing stage of FIG. 3. The cavities 32a have illustrated depths $D_1$ while the cavities 32b have illustrated depths $D_2$. In some embodiments, $D_1$ may be at least about 2 nm greater than $D_2$, at least about 4 nm greater than $D_2$, etc. In some embodiments, $D_1$ may be within a range of from about 10 nm to about 30 nm, and $D_2$ may be within a range of from about 8 nm to about 28 nm.

Each of the shallow cavities 32a occurs between a pair of the more recessed insulative levels 18a. In the shown embodiment, the shallow cavities are formed at the bottom of stack 15. Specifically, the bottommost two cavities of the vertically-stacked cavities formed at the processing stage of FIG. 4 are shallow cavities. In other embodiments, the shallow cavities may be formed at other locations within stack 15. Also, although two shallow cavities are formed, in other embodiments there may be only a single shallow cavity, or there may be more than two shallow cavities.

Another aspect of having the lower insulative levels 18 within stack 15 being more recessed relative to the upper insulative levels is that such may enable opening 30 to have an improved configuration relative to analogous prior art openings. Specifically, a problem with prior art fabrication processes analogous to that of FIGS. 3 and 4 may be that etching is slower at the bottom of opening 30 relative to the top of the opening, and accordingly the bottom of the opening may be much narrower than the top of the opening. However, in the shown embodiment of FIG. 4, the deeper recessing of insulative levels 18a relative to the levels 18b has enabled sufficient etching at the bottom of the opening provide a wider width at the bottom of the opening than at the top of the opening. Specifically, opening 30 is shown to have a width $W_1$ at the top, and a width $W_2$ at the bottom, with such widths corresponding to dimensions along the illustrated cross-section of FIG. 4, In some embodiments, $W_2$ may be at least 10% larger than $W_1$ (i.e., $W_2$ may be greater than or equal to 1.1 times $W_1$). In some embodiments, $W_1$ may be within a range of from about 50 nm to about 100 nm, and $W_2$ may be larger than $W_1$ by an amount within a range of from about 5 nm to about 10 nm.

Figure 5:
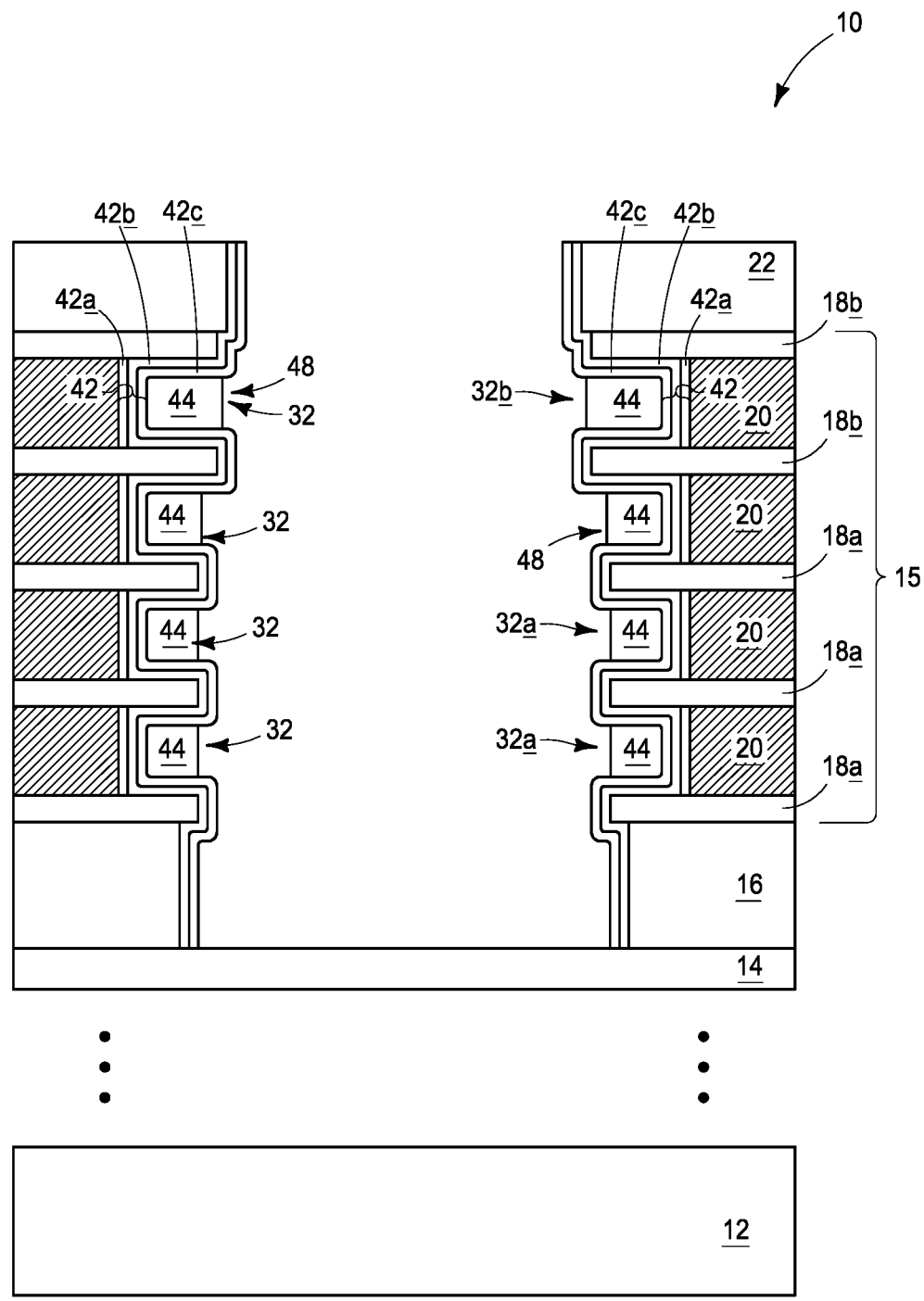

Referring to FIG. 5, charge-blocking dielectric 42 is formed within cavities 32. The charge-blocking dielectric may comprise any suitable composition or combination of compositions; and in some embodiments may comprise one or more of silicon nitride, silicon dioxide, hafnium oxide, zirconium oxide, etc. For instance, in the shown embodiment the charge-blocking dielectric 42 comprises three regions 42a, 42b and 42c, which may correspond to silicon dioxide, silicon nitride and oxide, respectively. The regions 42a, 42b and 42c may be referred to as first, second and third regions, respectively.

In some embodiments, the first region 42a may comprise silicon dioxide formed by oxidizing an exposed surface of polysilicon-containing conductive levels 20. Such oxidation may utilize any suitable conditions, such as, for example, in situ steam generation (ISSG). The first region 42a of the charge-blocking material is entirely contained within cavities 32 in the shown embodiment.

In some embodiments, the second region 42b may comprise silicon nitride formed by chemical vapor deposition and/or atomic layer deposition.

In some embodiments, the third region 42c may comprise an oxide formed by oxidation of a surface of the second region 42b. Accordingly, if second region 42b comprises silicon nitride, then third region 42c may comprise silicon oxynitride. The oxidation utilized to form third region 42c may utilize any suitable conditions, such as, for example, ISSG. In some embodiments, third region 42c may be formed by deposition alternatively to, or in addition to, oxidation. For instance, in some embodiments the third region 42c may be formed by deposition of silicon dioxide utilizing tetraethylorthosilicate precursor.

Charge-storage material 44 is formed over the charge-blocking dielectric 42, and is patterned into charge-storage structures 48 (only some of which are labeled). The charge-storage material 44 may comprise any suitable composition or combination of compositions; and in some embodiments may comprise floating gate material (for instance, doped or undoped silicon) or charge-trapping material (for instance, silicon nitride, metal dots, etc.).

Figure 6:
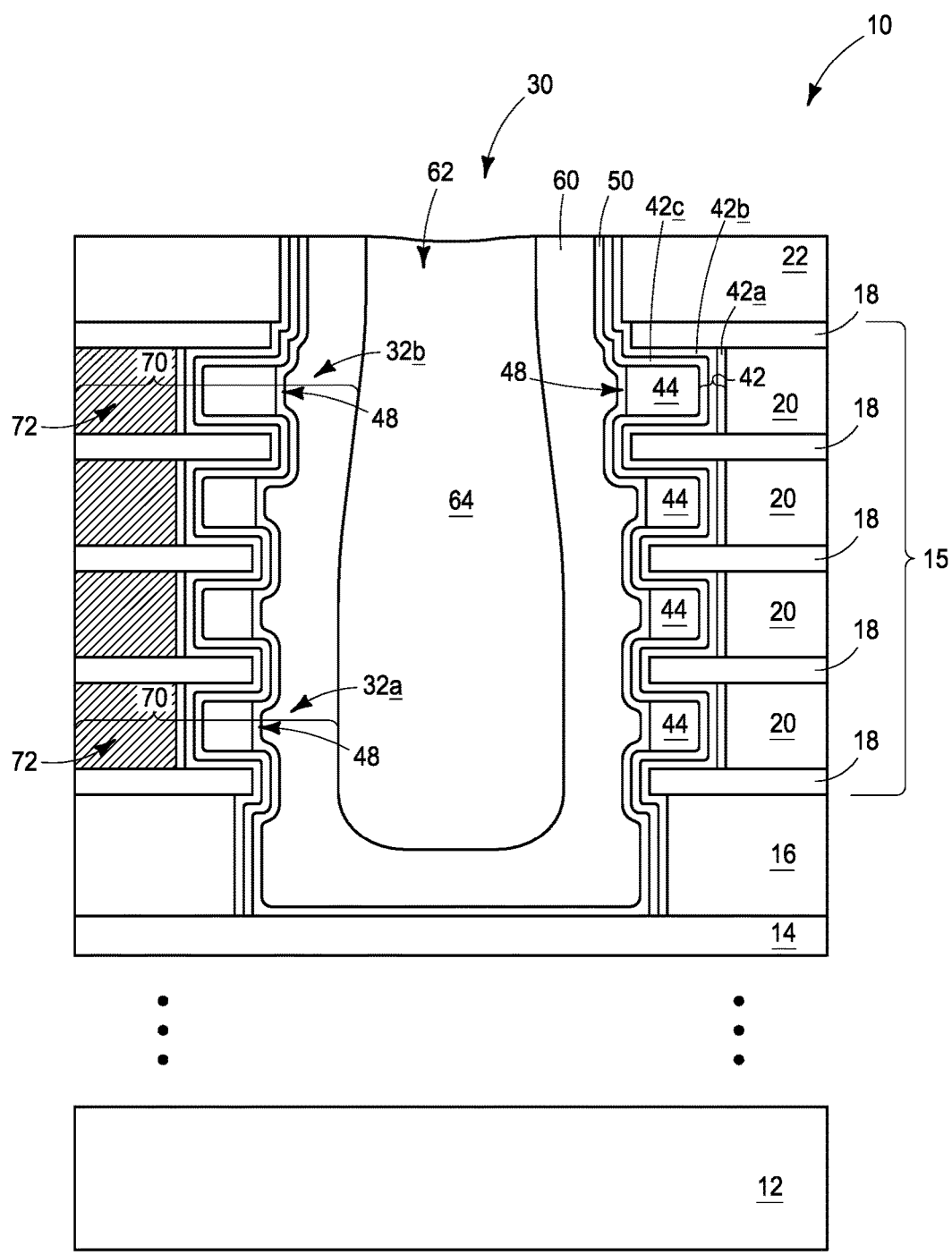

Referring to FIG. 6, gate dielectric 50 is formed along exposed edges of charge-storage material 44. The gate dielectric may be forming with any suitable processing, such as, for example, oxidation of exposed surfaces and/or deposition.

Channel material 60 is formed along the gate dielectric 50. The channel material may comprise any suitable composition or combination of compositions; and in some embodiments may comprise, consist essentially of, or consist of silicon. The channel material is shown to partially fill opening 30, and to thereby leave a remaining opening 62. Such is a hollow channel configuration, and in shown configuration opening 62 is filled with dielectric material 64 (for example, silicon dioxide).

Vertically-stacked memory cells 70 are formed by the various illustrated materials. Each memory cell comprises a charge-storage structure 48 and a control gate 72; with the control gates being comprised by regions of the conductive levels 20 adjacent the charge-storage structures.

The memory cells in recesses 32a are different than those in recesses 32b due to recesses 32a being shallower than recesses 32b. Such difference may enable some of the memory cells to be tailored for different applications than others of the memory cells. In some embodiments, it is the bottommost recesses which correspond to the shallow recesses 32a. In such embodiments, the memory cells formed within such recesses may correspond to dummy cells. In other embodiments, the memory cells formed within the shallow recesses may have other applications.

The embodiment of FIGS. 2-6 utilizes modification of two or more of insulative levels 18 (FIG. 2) to achieve the recessing of one or more of the cavities 32 (FIG. 4). In other embodiments, one or more of conductive levels 20 (FIG. 2) may be modified either in addition to, or alternatively to, the modification of two or more of insulative levels 18. An example embodiment utilizing modification of one or more of the conductive levels 20 is described with reference to FIGS. 7 and 8.

Figure 7:
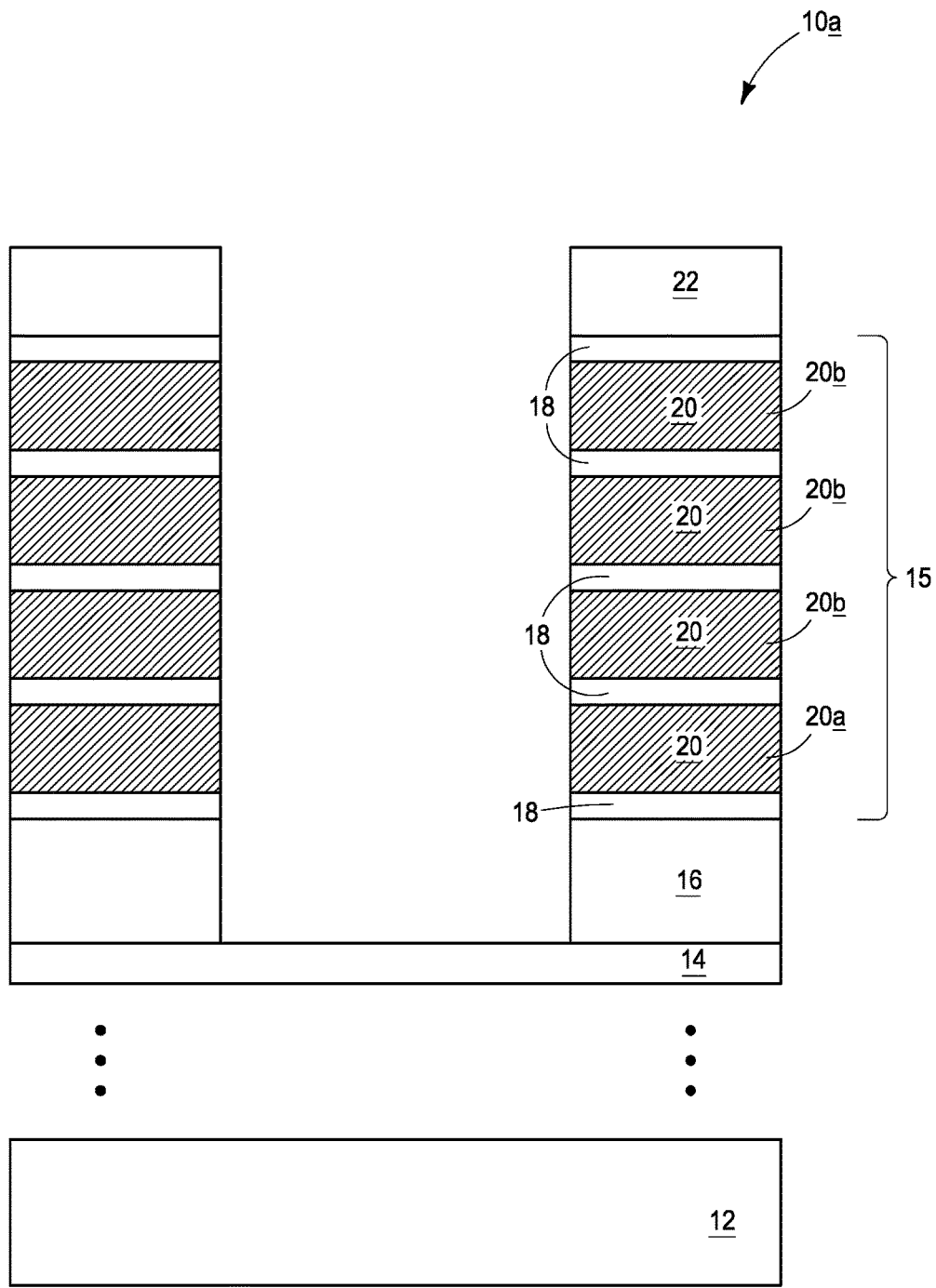

Referring to FIG. 7, a construction 10a is shown at a processing stage analogous to that of FIG. 2. The conductive levels 20 are shown subdivided amongst two types of conductive levels 20a and 20b. The conductive level 20a differs from the conductive levels 20b in a chemical property and/or a physical property. For instance, conductive levels 20a and 20b may comprise conductively-doped silicon; but conductive level 20a may comprise a different dopant concentration and/or a different dopant relative to conductive levels 20b.

Figure 8:
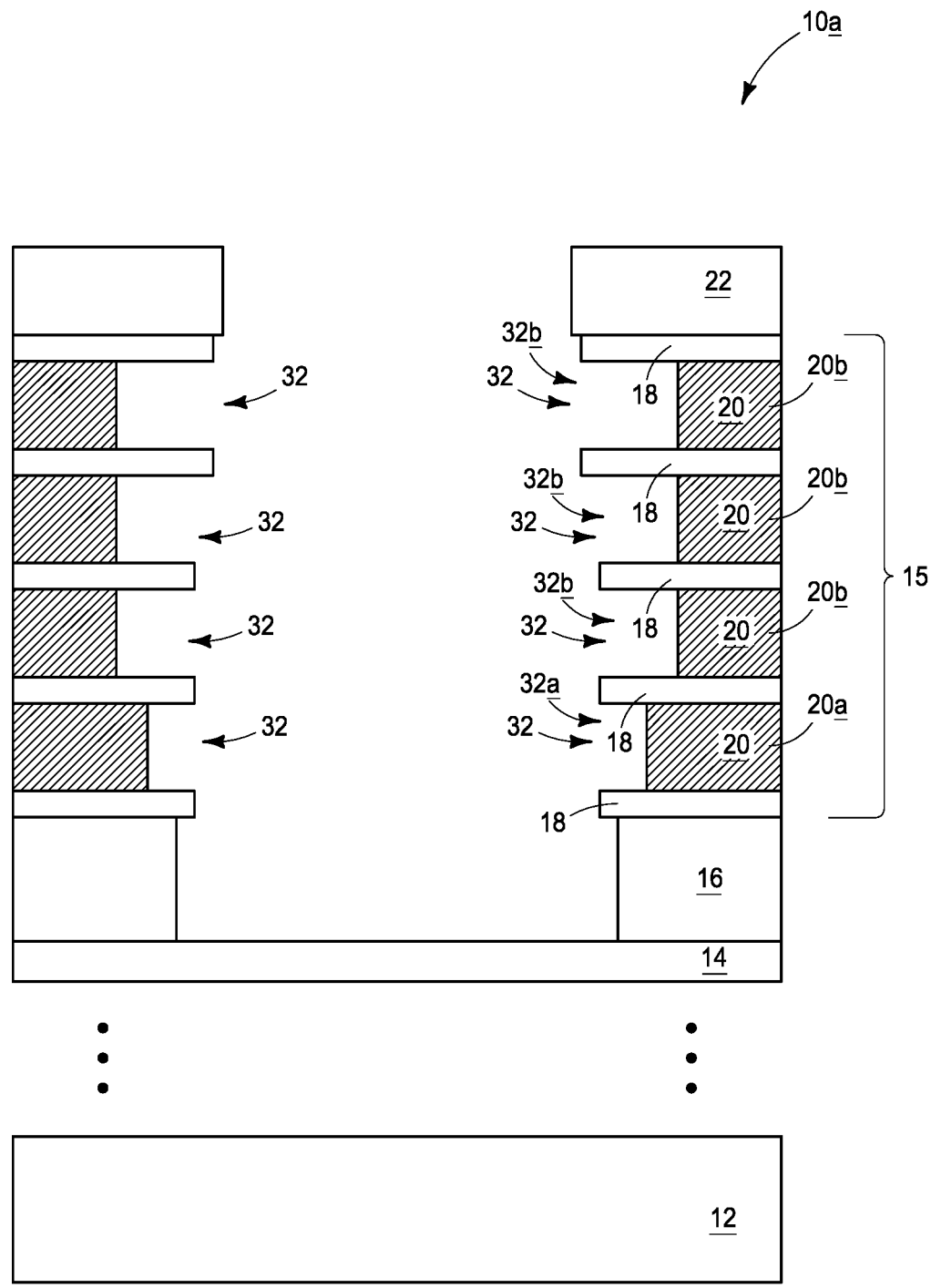

Referring to FIG. 8, conductive levels 20 are etched with processing analogous to that described above with reference to FIG. 4 (for instance, utilization of TMAH to etch doped silicon). Such etching forms cavities 32. However, the difference between conductive level 20a relative to levels 20b results in level 20a being etched more slowly than levels 20b. Accordingly, a cavity 32a extending into level 20a is shallower than cavities 32b extending into levels 20b. In the shown embodiment, the shallow cavity is a bottommost cavity formed within the conductive levels of stack 15. In other embodiments, one or more shallow cavities may be formed at other locations relative to stack 15.

The construction 10a may be subsequently utilized in processing analogous to that described above with reference to FIGS. 5-7 to form vertically-stacked memory cells; with the memory cells formed in the shallower cavities being different than those formed in the deeper cavities.

The architectures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming vertically-stacked memory cells. An opening is formed through a stack of alternating insulative and conductive levels. Cavities are formed to extend into the conductive levels along sidewalls of the opening. At least one of the cavities is formed to be shallower than one or more others of the cavities by at least about 2 nanometers. Charge-blocking dielectric and charge-storage structures are formed within the cavities.

Some embodiments include a method of forming vertically-stacked memory cells. A stack of alternating insulative and conductive levels is formed. Two or more of the insulative levels have different etch characteristics relative to others of the insulative levels. An opening is formed through the stack of alternating insulative, and conductive levels. The insulative levels are etched along sidewalls of the opening. Said two or more levels etch at least two-times faster than said others of the insulative levels. Cavities are formed to extend into the conductive levels along the sidewalls of the opening. The cavities are shallower between said two or more insulative levels than between said others of the insulative levels. Charge-blocking dielectric and charge-storage structures are formed within the cavities.

Some embodiments include an integrated structure having a stack of alternating insulative and conductive levels. Cavities extend into the conductive levels. At least one of the cavities is shallower than one or more others of the cavities by at least about 2 nanometers. Charge-blocking dielectric is within the cavities. Charge-storage structures are within the cavities.

Some embodiments include an integrated structure having a stack of alternating insulative and conductive levels. An opening extends through the stack. Cavities extend into the conductive levels along sidewalls of the opening. Charge-blocking dielectric is within the cavities. Charge-storage structures are within the cavities. Gate dielectric is within the opening and along the charge storage structures. Channel material is within the opening and along the gate dielectric. The opening has a top dimension along a cross-section, and has a bottom dimension along the cross-section. The bottom dimension is larger than the top dimension.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming vertically-stacked memory cells, comprising:
   forming a stack of alternating insulative and conductive levels, wherein the forming the stack comprises forming a first conductive level comprising a first conductive material and forming a second conductive level comprising a second conductive material that differs from the first material;
   forming a capping material over an uppermost level of the stack;
   forming an opening extending through the stack;
   etching the conductive levels to form cavities extending into each of the conductive levels along sidewalls of the opening, the cavities recessing all of the conductive levels comprised by the stack with each of the conductive levels being recessed relative to all of the insulative levels comprised by the stack; the etching removing the first conductive material more slowly than the second conductive material such that a first cavity formed in the first conductive level is at least about 2 nanometers shallower than a second cavity formed in the second conductive level; and
   forming charge-blocking dielectric and charge-storage structures within the cavities.

2. The method of claim 1 wherein the first cavity is formed to be at least about 4 nanometers shallower than the second cavity.

3. The method of claim 1 wherein the insulative levels comprise silicon dioxide and the conductive levels comprise conductively-doped silicon.

4. The method of claim 1 wherein the conductive levels comprise conductively-doped silicon; and wherein the first conductive material has a different dopant content than the second conductive material.

5. The method of claim 1 wherein the first cavity is a bottommost cavity formed in the stack.

6. The method of claim 1 wherein two vertically-stacked bottommost conductive levels comprise the first conductive material.

7. A method of forming vertically-stacked memory cells, comprising:
  forming a stack of alternating insulative and conductive levels, two or more of the insulative levels having different etch characteristics relative to others of the insulative levels;
  forming an opening through the stack of alternating insulative and conductive levels;
  etching into the insulative levels along sidewalls of the opening, the etching recessing the insulative levels relative to the conductive levels; said two or more levels etching at least two-times faster than said others of the insulative levels;
  after etching into the insulative levels, forming cavities extending into the conductive levels along the sidewalls of the opening, the cavities recessing all of the conductive levels of the stack with each of the conductive levels being recessed relative to all the insulative levels comprised by the stack; the cavities being shallower between said two or more insulative levels than between said others of the insulative levels; and
  forming charge-blocking dielectric and charge-storage structures within the cavities.

8. The method of claim 7 wherein the insulative levels comprise silicon dioxide and the conductive levels comprise conductively-doped silicon.

9. The method of claim 8 wherein the etching into the insulative levels utilizes hydrofluoric acid.

10. The method of claim 9 wherein said two or more insulative levels are less dense than said others of the insulative levels.

11. The method of claim 9 wherein said two or more insulative levels etch at least three-times faster with the hydrofluoric acid than said others of the insulative levels.

12. The method of claim 7 wherein said two or more insulative levels include a bottom two of the insulative levels.

13. The method of claim 7 wherein said two or more insulative levels include a bottom three of the insulative levels.

* * * * *